(12) United States Patent
Li et al.

(10) Patent No.: US 9,466,484 B1
(45) Date of Patent: Oct. 11, 2016

(54) MANUFACTURING METHOD OF SEMICONDUCTOR DEVICE

(71) Applicant: UNITED MICROELECTRONICS CORP., Hsinchu (TW)

(72) Inventors: Kun-Ju Li, Tainan (TW); Yu-Ting Li, Chiayi (TW); Po-Cheng Huang, Kaohsiung (TW); Fu-Shou Tsai, Keelung (TW); Wu-Sian Sie, Tainan (TW); I-Lun Hung, Tainan (TW); Chun-Tsen Lu, Tainan (TW); Shih-Ming Lin, Taipei (TW); Lan-Ping Chang, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/859,491

(22) Filed: Sep. 21, 2015

(51) Int. Cl.
  H01L 21/31   (2006.01)
  H01L 21/02   (2006.01)
  H01L 21/3205 (2006.01)
  H01L 21/3213 (2006.01)
  H01L 27/11   (2006.01)

(52) U.S. Cl.
  CPC ... *H01L 21/02675* (2013.01); *H01L 21/32055* (2013.01); *H01L 21/32133* (2013.01); *H01L 27/11* (2013.01)

(58) Field of Classification Search
  CPC ............ H01L 21/823431; H01L 21/845; H01L 27/0886
  USPC .......................................................... 438/778
  See application file for complete search history.

(56) References Cited

U.S. PATENT DOCUMENTS

| 6,080,643 A | 6/2000 | Noguchi et al. |
| 6,635,555 B2 | 10/2003 | Voutsas |
| 2013/0244392 A1* | 9/2013 | Oh .......... H01L 29/66477 438/299 |

OTHER PUBLICATIONS

U.S. Appl. No. 14/656,733, filed Mar. 13, 2015.

* cited by examiner

*Primary Examiner* — Elias M Ullah
(74) *Attorney, Agent, or Firm* — WPAT, PC; Justin King (57) ABSTRACT

A manufacturing method of a semiconductor device is provided. The manufacturing method includes the following steps. A plurality of fin structures are formed in a first area and a second area of a substrate. A first density of the fin structures in the first area is lower than a second density of the fin structures in the second area. A gate dielectric layer is formed on the fin structures. An amorphous silicon layer is formed on the gate dielectric layer and the fin structures in the first area and the second area. Part of the amorphous silicon layer which is disposed in the first area is annealed to form a crystalline silicon layer by a laser. The crystalline silicon layer disposed in the first area and the amorphous silicon layer disposed in the second area are polished.

20 Claims, 8 Drawing Sheets

MANUFACTURING METHOD OF SEMICONDUCTOR DEVICE

BACKGROUND

1. Technical Field

The disclosure relates in general to a manufacturing method of a semiconductor device, and more particularly to a manufacturing method of a semiconductor device including a plurality of fin structures.

2. Description of the Related Art

According to the development of the semiconductor technology, a system on chip (SOC) is an integrated circuit that integrates all components of a computer or other electronic system into a single chip. It may contain digital elements, memory cells, analog elements, mixed-signal elements, and radio-frequency function elements. All of those elements are integrated on a single chip substrate. The system on chip (SOC) integrated circuit which has small volume, low power consumption and short response time has been widely used in daily life and business.

A semiconductor device may be divided into several areas. In one case, a top surface of one area may be much rougher than a top surface of another area. In this case, a material disposed in those two areas may not be polished to be flat. The nonplanar surface will generate physical defects in back-end manufacturing processes and may cause electrical defects, such as shorts and opens that interfere with device performance and therefore decrease yield. One process-induced defect is caused from residual material which arises when excess material deposited on back-end structures is not completely removed by a planarization process such as chemical-mechanical planarization (CMP). For example, process-induced defects can occur due to a non-uniform pattern density which leads to a non-uniform polish. Therefore, it is an important quality issue to be solved.

SUMMARY

The disclosure is directed to a manufacturing method of a semiconductor device. A step of laser annealing is performed, such that a material disposed in a smooth area and a rough area can be polished to be flat.

According to one embodiment, a manufacturing method of a semiconductor device is provided. The manufacturing method includes the following steps. A plurality of fin structures are formed in a first area and a second area of a substrate. A first density of the fin structures in the first area is lower than a second density of the fin structures in the second area. A gate dielectric layer is formed on the fin structures. An amorphous silicon layer is formed on the gate dielectric layer and the fin structures in the first area and the second area. The amorphous silicon layer is formed as a dummy gate electrode in a replacement gate process. Part of the amorphous silicon layer which is disposed in the first area is annealed to form a crystalline silicon layer by a laser. The crystalline silicon layer disposed in the first area and the amorphous silicon layer disposed in the second area are polished.

According to another embodiment, a manufacturing method of a semiconductor device is provided. The manufacturing method includes the following steps. A plurality of fin structures are formed in a first area and a second area of a substrate. A first density of the fin structures in the first area is lower than a second density of the fin structures in the second area. A gate dielectric layer is formed on the fin structures. An amorphous silicon layer is formed on the gate dielectric layer and the fin structures in the first area and the second area. The amorphous silicon layer is formed as a dummy gate electrode in a replacement gate process. Part of the amorphous silicon layer which is disposed in the second area is annealed to form a crystalline silicon layer by a laser. The amorphous silicon layer disposed in the first area and the crystalline silicon layer disposed in the second area are etched. The first area and the second area are polished.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
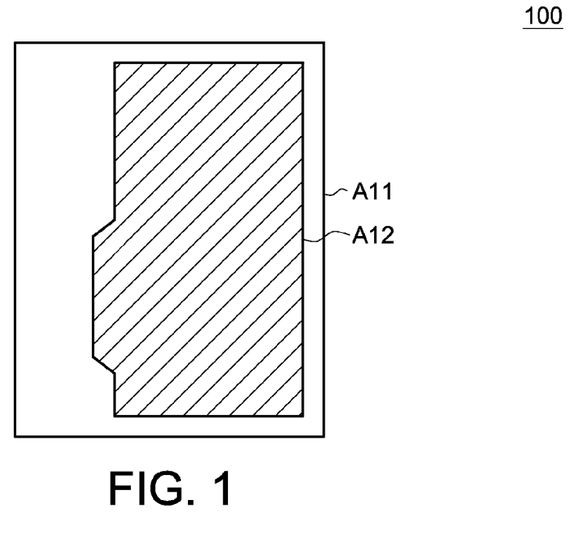
FIG. 1 shows a semiconductor device.

Please refer to FIG. 1, which shows a semiconductor device 100. The semiconductor device 100 may be a SRAM, or other memory devices. The semiconductor device 100 has a first area A11 and a second area A12. A logic circuit or a plurality of testing pads may be disposed in the first area A11, and a plurality of memory cells may be disposed in the second area A12. For example, the logic circuit may include a NOR element, an AND element, an OR element, an XOR element, a shifter, an addition element, a JK Flip-Flop, a counter and a register. The memory cells are closely arranged in an array.

Figure 2:
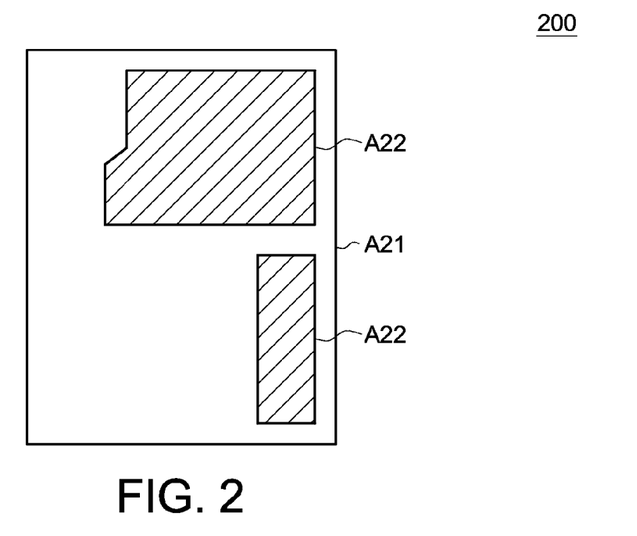
FIG. 2 shows another semiconductor device.

Please refer to FIG. 2, which shows another semiconductor device 200. In another embodiment, the number of the first area A21 may be one and the number of the second area A22 may be more than two. For example, in FIG. 2, there are two second areas A22. The second areas A22 may be used for being disposed two different kinds of elements.

Figure 3:
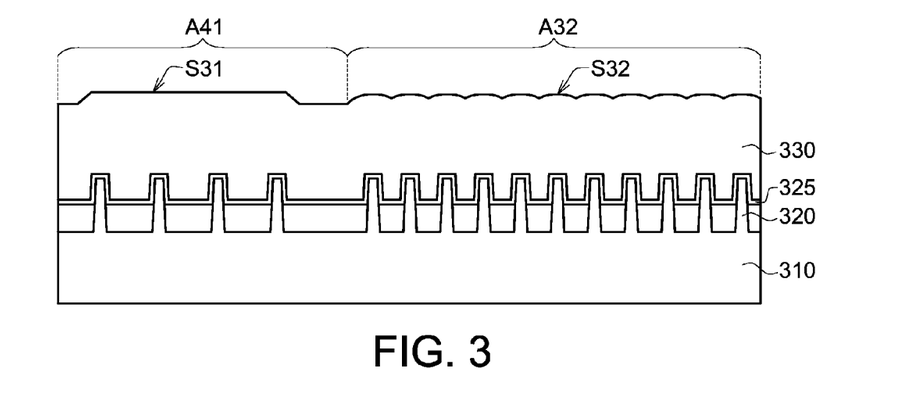
FIG. 3 shows a plurality of fin structure.

Please refer to FIG. 3. A gate forming process of the present invention is applied to a gate-last for high-k last process including the following steps. A gate dielectric layer 325 is formed on a plurality of fin structures 320. The gate dielectric layer 325 may be an oxide layer or a high k material layer. A gate electrode layer is an amorphous silicon layer 330 but it will be replaced by metal layers in subsequent processes. The fin structures 320 are used to form the logic circuit in a first area A31 of a substrate 310 or the memory cells in a second area A32 of the substrate 310. The fin structures 320 in the second area A32 are arranged closely, such that the memory cells formed in the second area A32 can be arranged closely. Therefore, a first density of the fin structures 320 in the first area A31 is lower than a second density of the fin structures 320 in the second area A32. When the amorphous silicon layer 330 is formed on the gate dielectric layer 325 and the fin structures 320, a top surface S31 of the amorphous silicon layer 330 will be smoother than a top surface S32 of the amorphous silicon layer 330. When a chemical-mechanical planarization process (CMP process) is performing, a contact area between the top surface S31 and a polishing pad is smaller than a contact area between the top surface S32 of the polishing pad. Therefore, a force applied on the top surface S31 will be larger than a force applied on the top surface S32, and the amorphous silicon layer 330 formed on the fin structures 320 may not be polished to be flat.

Figure 4:
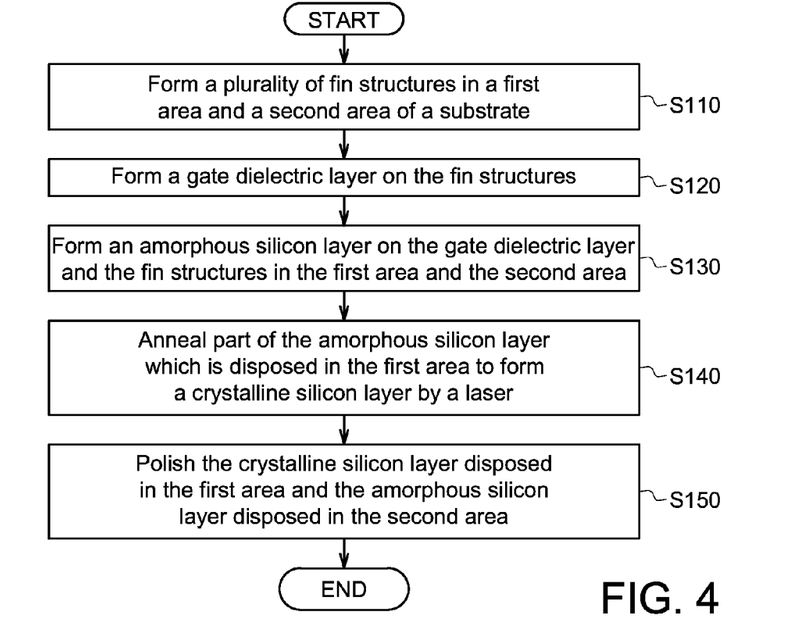
FIG. 4 shows a flowchart of a manufacturing method of a semiconductor device according to an embodiment.

Please refer to FIGS. 4 and 5A to 5D. FIG. 4 shows a flowchart of a manufacturing method of a semiconductor device 400 according to an embodiment, and FIGS. 5A to 5D illustrate those steps described in FIG. 4. By performing the manufacturing method described in FIG. 4, an amorphous silicon layer 430 (shown in FIG. 5D) formed on a plurality of fin structures 420 can be polished to be flat.

Figure 5A:
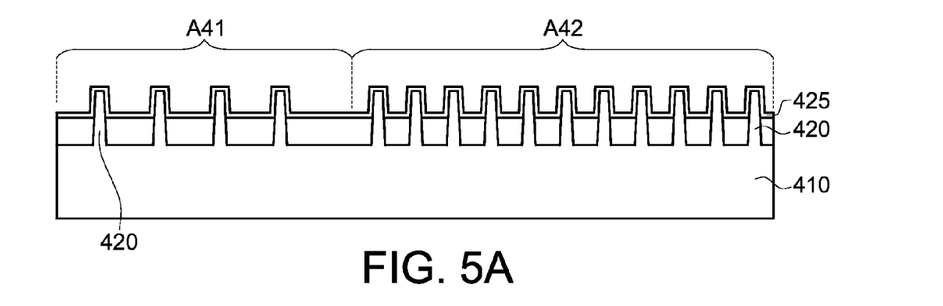
FIGS. 5A to 5D illustrate those steps described in FIG. 4.

In step S110, referring to FIG. 5A, the fin structures 420 are formed in a first area A41 and a second area A42 of a substrate 410. A first density of the fin structures 420 in the first area A41 is lower than a second density of the fin structures 420 in the second area A42. Similar to the first area A11, A21 and the second area A12, A22, a logic circuit or a plurality of testing pad may be disposed in the first area A41, and a plurality of memory cells may be disposed in the second area A42.

In one embodiment, a difference between the first density of the fin structures 420 in the first area A41 and the second density of the fin structures 420 in the second area A42 is larger than 10%. For example, the first density of the fin structures 420 in the first area A41 is 15% to 35%, and the second density of the fin structures 420 in the second area A42 is 35% to 45%.

In step S120, referring to FIG. 5A, a gate dielectric layer 420 is formed on the fin structures 420.

Figure 5B:
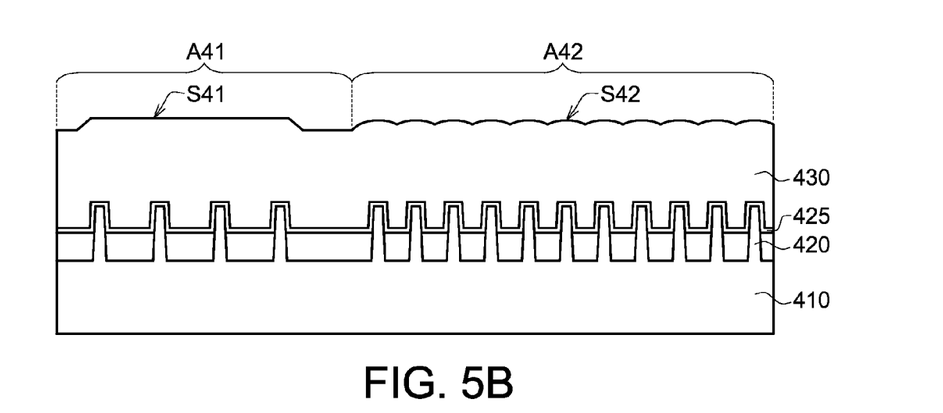

In step S130, referring to FIG. 5B, the amorphous silicon layer 430 is formed on the gate dielectric layer 425 and the fin structures 420 in the first area A41 and the second area A42. The amorphous silicon layer 430 is formed as a dummy gate electrode in a replacement gate process. Because the first density of fin structures 420 in the first area A41 is lower than the second density of the fin structures 420 in the second area A42, a top surface S41 of the amorphous silicon layer 430 is smoother than a top surface S42 of the amorphous silicon layer 430.

Figure 5C:
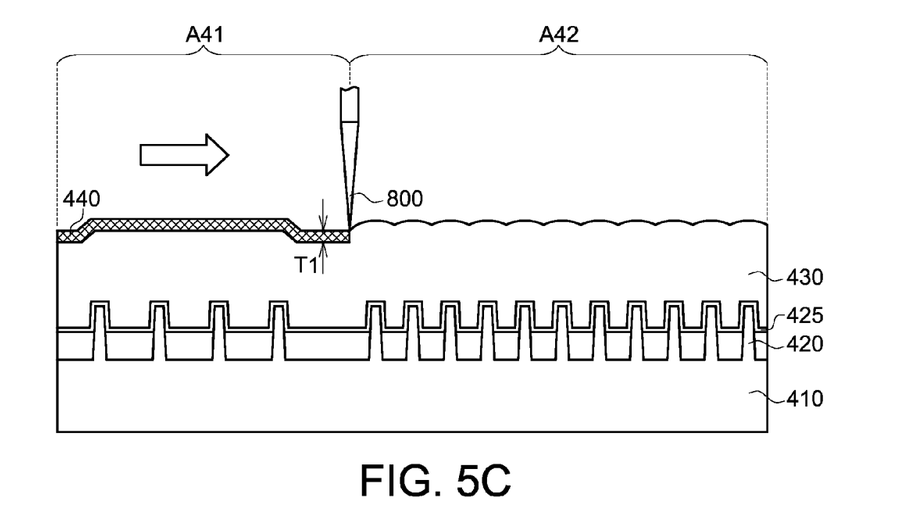

In step S140, referring to FIG. 5C, part of the amorphous silicon layer 430 which is disposed in the first area A41 is annealed to form a crystalline silicon layer 440 by a laser 800. In this step, a thickness T1 of the crystalline silicon layer 440 disposed in the first area A41 is controlled to be 50 Å to 150 Å.

In one embodiment, the laser 800 is a picosecond pulsed laser or a nanosecond pulsed laser. A wavelength of the laser 800 is 532 um or 1064 um and a power driving the laser 800 is 5 W to 10 W.

Figure 5D:
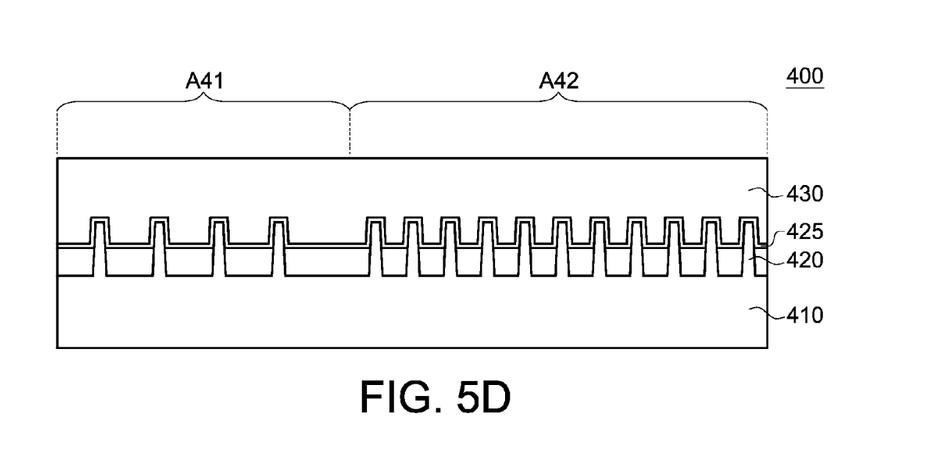

In step S150, referring to FIG. 5D, the crystalline silicon layer 440 disposed in the first area A41 and the amorphous silicon layer 430 disposed in the second area A42 are polished. In this step, the crystalline silicon layer 440 and the amorphous silicon layer 430 are polished by a chemical-mechanical planarization process (CMP process). The crystalline silicon layer 440 disposed in the first area A41 is polished at a first removal rate, and the amorphous silicon layer 430 disposed in the second area A42 is polished at a second removal rate. Because the crystalline silicon layer 440 is harder than the amorphous silicon layer 430, the first removal rate will be less than the second removal rate. The first removal rate and the second removal rate are controlled, such that the second removal rate is 50 Å/min higher than the first removal rate. Therefore, the crystalline silicon layer 440 (shown in FIG. 5C) can act as a stop layer, such that the amorphous silicon layer 430 formed on the fin structures 420 can be polished to be flat.

Figure 6:
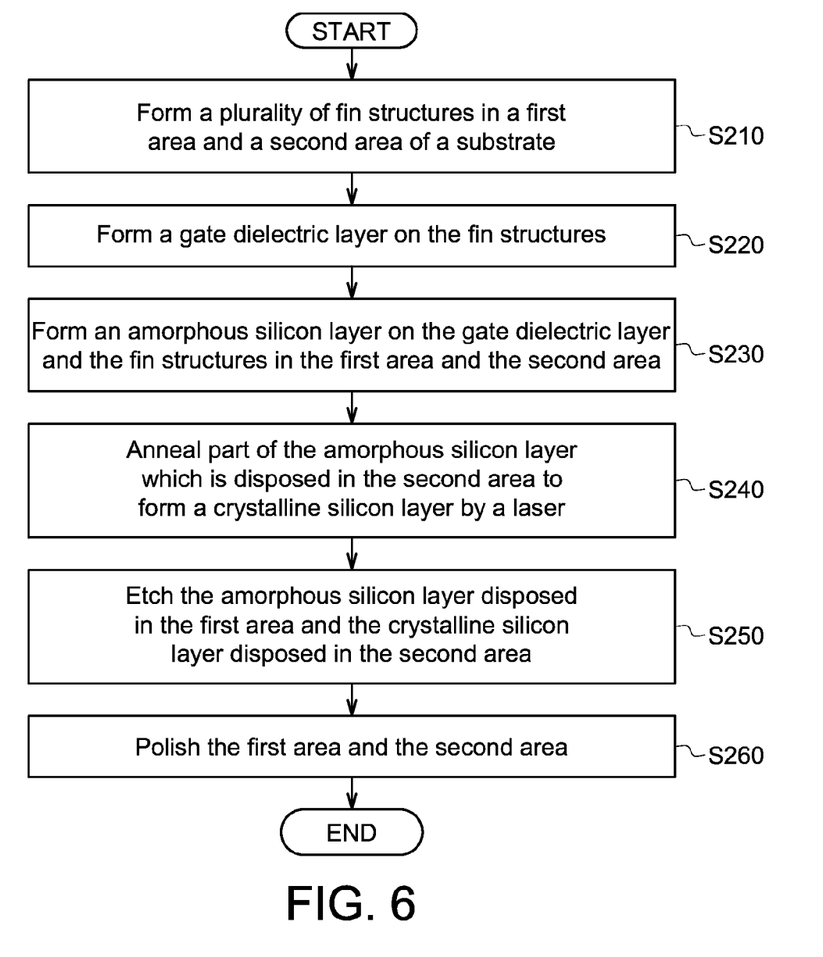
FIG. 6 shows a flowchart of a manufacturing method of a semiconductor device according to another embodiment.

Please refer to FIGS. 6 and 7A to 7E. FIG. 6 shows a flowchart of a manufacturing method of a semiconductor device 500 according to another embodiment, and FIGS. 7A to 7E illustrate those steps described in FIG. 6. By performing the manufacturing method described in FIG. 6, an amorphous silicon layer 530 (shown in FIG. 6D) formed on a plurality of fin structures 520 can be polished to be flat. In steps S210, S220 and S230, referring to FIGS. 7A and 7B, a plurality of fin structures 520 are formed in a first area A51 and a second area A51 of a substrate 510, a gate dielectric layer 525 is formed on the fin structures 520, and an amorphous silicon layer 530 is formed on the gate dielectric layer 525 and the fin structures 520 in the first area A52 and the second area A52. The amorphous silicon layer 530 is formed as a dummy gate electrode in a replacement gate process. The steps S210, S220 and S230 of FIG. 6 are similar to the steps S110, S120 and S130 of FIG. 4. Similarities will not be repeated here.

Figure 7A:
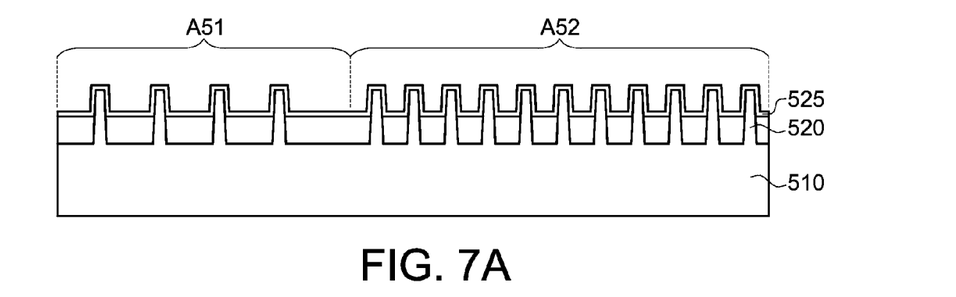
FIGS. 7A to 7E illustrate those steps described in FIG. 6.
Figure 7B:
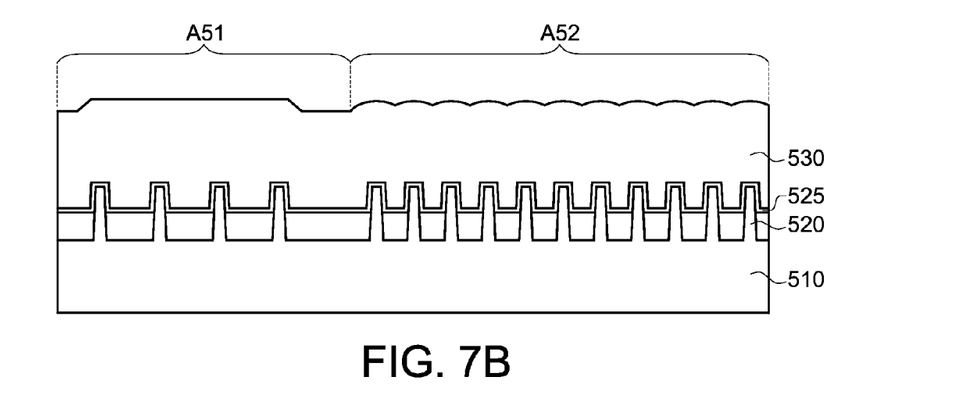
Figure 7C:
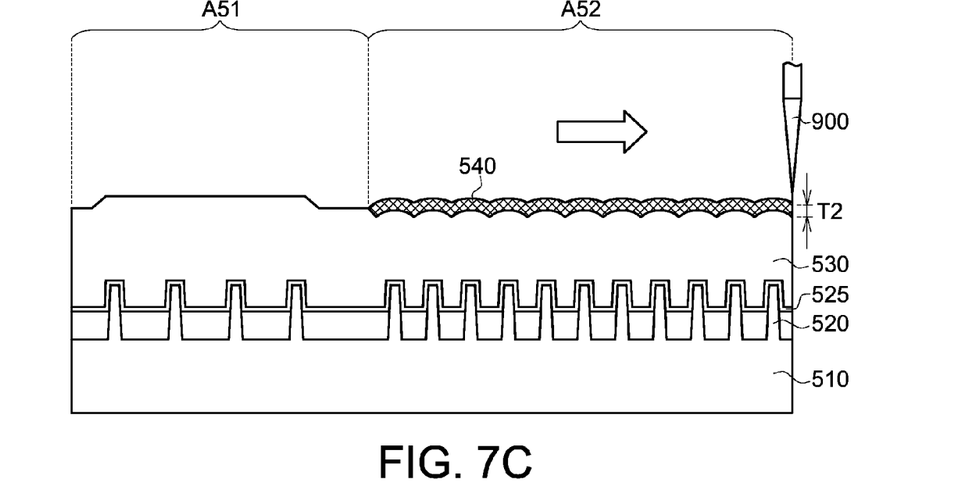

In step S240, referring to FIG. 7C, part of the amorphous silicon layer 530 which is disposed in the second area A52 is annealed to form a crystalline silicon layer 540 by a laser 900. In this step, a thickness T2 of the crystalline silicon layer 540 disposed in the second area A52 is controlled to be 50 Å to 150 Å. In one embodiment, the laser 900 is a picosecond pulsed laser or a nanosecond pulsed laser. A wavelength of the laser 900 is 532 um or 1064 um and a power driving the laser 900 is 5 W to 10 W.

Figure 7D:
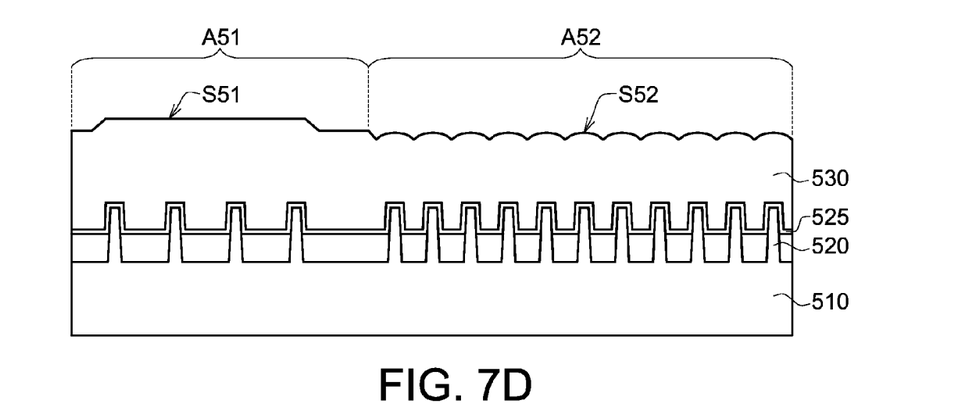

In step S250, referring to FIG. 7D, the amorphous silicon layer 530 disposed in the first area A51 and the crystalline silicon layer 540 (shown in FIG. 7C) disposed in the second area A52 are etched. In one embodiment, this step is performed by a dry etching process.

In this step, the amorphous silicon layer 530 disposed in the first area A51 is etched at a first etching rate, and the crystalline silicon layer 540 (shown in FIG. 7C) disposed in the second area A52 is etched at a second etching rate. Because the crystalline silicon layer 540 (shown in FIG. 7C) is more reactive than the amorphous silicon layer 530, the first etching rate will be less than the second etching rate. For example, the first etching rate and the second etching rate are controlled, such that a ratio of the first etching rate to the second etching rate is 0.7 to 0.9.

Because the first etching rate is less than the second etching rate, after the step S250 is performed, a top in the first area A51 is higher than a top in the second area A52. In one embodiment, the crystalline silicon layer 540 (shown in FIG. 7C) may be totally removed, such that the amorphous silicon layer 530 disposed in the second area A52 is exposed. Or, in another embodiment, the crystalline silicon layer 540 (shown in FIG. 7C) may not be totally removed, such that part of the crystalline silicon layer 540 (shown in FIG. 7C) disposed in the second area A52 remains.

Figure 7E:
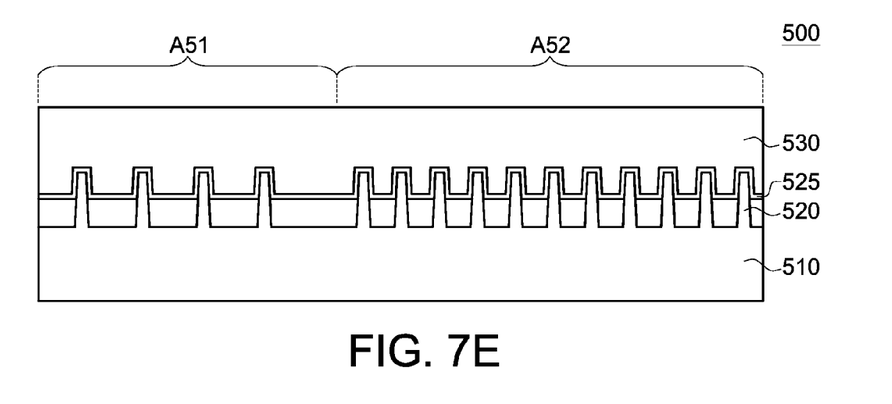

In step S260, referring to FIG. 7E, the first area A51 and the second area A52 are polished. In this step, the first area A51 and the second area A52 are polished by a chemical-mechanical planarization process (CMP process). A top surface S51 (shown in FIG. 7D) in the first area A51 is smoother than a top surface S52 (shown in FIG. 7D) in the second area A52. A contact area between the top surface S51 and a polishing pad is smaller than a contact area between the top surface S52 and the polishing pad. A force applied on the top surface S51 will be larger than a force applied on the top surface S52.

In this step, the amorphous silicon layer 530 disposed in the first area A51 is polished at a first removal rate, and the amorphous silicon layer 530 (or the remained crystalline silicon layer 540) disposed in the second area A52 is polished at a second removal rate. Because the force applied on the top surface S51 is larger than the force applied on the top surface S52 and the amorphous silicon layer 530 is softer than the remained crystalline silicon layer 540, the first removal rate will be larger than the second removal rate. However, because the top in the first area A51 is higher than the top in the second area A52, the amorphous silicon layer 530 can be polished to be flat finally.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A manufacturing method of a semiconductor device, comprising:
   forming a plurality of fin structures in a first area and a second area of a substrate, wherein a first density of the fin structures in the first area is lower than a second density of the fin structures in the second area;
   forming a gate dielectric layer on the fin structures;
   forming an amorphous silicon layer on the gate dielectric layer and the fin structures in the first area and the second area;
   annealing part of the amorphous silicon layer which is disposed in the first area to form a crystalline silicon layer by a laser; and
   polishing the crystalline silicon layer disposed in the first area and the amorphous silicon layer disposed in the second area.

2. The manufacturing method of the semiconductor device according to claim 1, wherein in the step of forming the fin structures in the first area and the second area of the substrate, a difference between the first density of the fin structures in the first area and the second density of the fin structures in the second area is larger than 10%.

3. The manufacturing method of the semiconductor device according to claim 1, wherein in the step of forming the fin structures in the first area and the second area of the substrate, the first density of the fin structures in the first area is 15% to 35%, and the second density of the fin structures in the second area is 35% to 45%.

4. The manufacturing method of the semiconductor device according to claim 1, wherein a logic circuit is disposed in the first area, and a plurality of memory cells of a SRAM are disposed in the second area.

5. The manufacturing method of the semiconductor device according to claim 1, wherein in the step of annealing part of the amorphous silicon layer which is disposed in the first area to form the crystalline silicon layer, a wavelength of the laser is 532 um or 1064 um.

6. The manufacturing method of the semiconductor device according to claim 1, wherein in the step of annealing part of the amorphous silicon layer which is disposed in the first area to form the crystalline silicon layer, the laser is a picosecond pulsed laser or a nanosecond pulsed laser.

7. The manufacturing method of the semiconductor device according to claim 1, wherein in the step of annealing part of the amorphous silicon layer which is disposed in the first area to form the crystalline silicon layer, a power driving the laser is 5 W to 10 W.

8. The manufacturing method of the semiconductor device according to claim 1, wherein after the step of annealing part of the amorphous silicon layer which is disposed in the first area to form the crystalline silicon layer is performed, a thickness of the crystalline silicon layer disposed in the first area is 50 Å to 150 Å.

9. The manufacturing method of the semiconductor device according to claim 1, wherein
   in the step of polishing the crystalline silicon layer disposed in the first area and the amorphous silicon layer in the second area, the crystalline silicon layer disposed in the first area is polished at a first removal rate, and the amorphous silicon layer disposed in the second area is polished at a second removal rate; and
   the first removal rate and the second removal rate are controlled, such that the second removal rate is 50 Å/min higher than the first removal rate.

10. A manufacturing method of a semiconductor device, comprising:
    forming a plurality of fin structures in a first area and a second area of a substrate, wherein a first density of the fin structures in the first area is lower than a second density of the fin structures in the second area;
    forming a gate dielectric layer on the fin structures;
    forming an amorphous silicon layer on the gate dielectric layer and the fin structures in the first area and the second area;
    annealing part of the amorphous silicon layer which is disposed in the second area to form a crystalline silicon layer by a laser;
    etching the amorphous silicon layer disposed in the first area and the crystalline silicon layer disposed in the second area; and
    polishing the first area and the second area.

11. The manufacturing method of the semiconductor device according to claim 10, wherein in the step of forming the fin structures in the first area and the second area of the substrate, a difference between the first density of the fin structures in the first area and the second density of the fin structures in the second area is larger than 10%.

12. The manufacturing method of the semiconductor device according to claim 10, wherein in the step of forming the fin structures in the first area and the second area of the substrate, the first density of the fin structures in the first area is 15% to 35%, and the second density of the fin structures in the second area is 35% to 45%.

13. The manufacturing method of the semiconductor device according to claim 10, wherein a logic circuit is disposed in the first area, and a plurality of memory cells of a SRAM are disposed in the second area.

14. The manufacturing method of the semiconductor device according to claim 10, wherein in the step of annealing part of the amorphous silicon layer which is disposed in the second area to form the crystalline silicon layer, a wavelength of the laser is 532 um or 1064 um.

15. The manufacturing method of the semiconductor device according to claim 10, wherein in the step of annealing part of the amorphous silicon layer which is disposed in the second area to form the crystalline silicon layer, the laser is a picosecond pulsed laser or a nanosecond pulsed laser.

16. The manufacturing method of the semiconductor device according to claim 10, wherein in the step of annealing part of the amorphous silicon layer which is disposed in the second area to form the crystalline silicon layer, a power driving the laser is 5 W to 10 W.

17. The manufacturing method of the semiconductor device according to claim 10, wherein after the step of annealing part of the amorphous silicon layer which is disposed in the second area to form the crystalline silicon layer is performed, a thickness of the crystalline silicon layer disposed in the second area is 50 Å to 150 Å.

18. The manufacturing method of the semiconductor device according to claim 10, wherein after the step of etching the amorphous silicon layer disposed in the first area and the crystalline silicon layer disposed in the second area is performed, the amorphous silicon layer disposed in the second area is exposed.

19. The manufacturing method of the semiconductor device according to claim 10, wherein after the step of etching the amorphous silicon layer disposed in the first area and the crystalline silicon layer disposed in the second area is performed, a top in the first area is higher than a top in the second area.

20. The manufacturing method of the semiconductor device according to claim 10, wherein
- in the step of etching the amorphous silicon layer disposed in the first area and the crystalline silicon layer in the second area, the amorphous silicon layer disposed in the first area is etched at a first etching rate, and the crystalline silicon layer disposed in the second area is etched at a second etching rate; and
- the first etching rate and the second etching rate are controlled, such that a ratio of the first etching rate to the second etching rate is 0.7 to 0.9.

* * * * *